(12) United States Patent
Honda et al.

(10) Patent No.: US 12,562,693 B2
(45) Date of Patent: Feb. 24, 2026

(54) MATCHING CIRCUIT AND POWER AMPLIFIER CIRCUIT

(71) Applicant: Murata Manufacturing Co., Ltd., Kyoto (JP)

(72) Inventors: Yuri Honda, Kyoto (JP); Jun Enomoto, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1097 days.

(21) Appl. No.: 17/315,911

(22) Filed: May 10, 2021

(65) Prior Publication Data

US 2021/0359649 A1     Nov. 18, 2021

(30) Foreign Application Priority Data

May 12, 2020     (JP) ................................. 2020-083552
Dec. 14, 2020     (JP) ................................. 2020-206817

(51) Int. Cl.
*H03F 1/56*         (2006.01)
*H03F 3/21*         (2006.01)

(52) U.S. Cl.
CPC .............. *H03F 1/565* (2013.01); *H03F 3/211* (2013.01); *H03F 2200/387* (2013.01); *H03F 2200/451* (2013.01)

(58) Field of Classification Search
CPC .... H03F 1/565; H03F 3/211; H03F 2200/387; H03F 2200/451

USPC .......................................................... 330/291
See application file for complete search history.

(56) References Cited

U.S. PATENT DOCUMENTS

| | | | | |
|---|---|---|---|---|
| 6,331,815 | B1 * | 12/2001 | Oshima ................. | H03H 7/383 |
| | | | | 343/822 |
| 9,503,025 | B2 * | 11/2016 | Cao ......................... | H03F 3/245 |
| 9,571,044 | B1 * | 2/2017 | Zhu ......................... | H01L 23/66 |
| 9,660,606 | B2 | 5/2017 | Lyalin et al. | |
| 11,381,204 | B2 * | 7/2022 | Namie ................. | H03F 1/0205 |
| 2002/0118067 | A1 | 8/2002 | Hirayama | |
| 2013/0187712 | A1 * | 7/2013 | Cabanillas .............. | H03F 1/565 |
| | | | | 330/192 |
| 2017/0084998 | A1 * | 3/2017 | Ishizuka ................. | H01Q 1/243 |
| 2018/0102754 | A1 * | 4/2018 | Tanaka ..................... | H03H 7/38 |
| 2019/0245508 | A1 | 8/2019 | Lyalin et al. | |
| 2019/0296693 | A1 * | 9/2019 | Ahmed ................... | H03F 3/195 |
| 2020/0014344 | A1 * | 1/2020 | Arayashiki ............. | H03F 3/211 |
| 2020/0076396 | A1 * | 3/2020 | Jin ............................ | H03H 7/40 |
| 2020/0144965 | A1 | 5/2020 | Namie et al. | |
| 2021/0234519 | A1 * | 7/2021 | Tanaka ................. | H03F 1/0205 |
| 2021/0359649 | A1 * | 11/2021 | Honda ................... | H03F 3/211 |
| 2022/0337204 | A1 * | 10/2022 | Sasaki ..................... | H03F 3/601 |

* cited by examiner

*Primary Examiner* — Andrea Lindgren Baltzell
*Assistant Examiner* — Jose E Pinero
(74) *Attorney, Agent, or Firm* — McDonald Hopkins LLC

(57) ABSTRACT

A matching circuit includes an input terminal configured to receive an amplified signal from a power amplifier, an output terminal, a first inductor having a first end connected to the input terminal, and a second end connected to the output terminal, a first capacitor connected in parallel to the first inductor, a second inductor having a first end connected to the input terminal, and a second end connected to ground, and a first series resonant circuit connected in parallel to the second inductor.

17 Claims, 16 Drawing Sheets

MATCHING CIRCUIT AND POWER AMPLIFIER CIRCUIT

CROSS REFERENCE TO RELATED APPLICATIONS

This application claims priority from Japanese Patent Application No. 2020-083552 filed on May 12, 2020, and claims priority from Japanese Patent Application No. 2020-206817 filed on Dec. 14, 2020. The contents of these applications are incorporated herein by reference in their entireties.

BACKGROUND

The present disclosure relates to a matching circuit and a power amplifier circuit. A mobile communication terminal, such as a mobile phone includes a power amplifier circuit for amplifying a radio-frequency (RF) signal to be transmitted to a base station. The power amplifier circuit includes a matching circuit to improve the efficiency of the power amplifier circuit.

A matching circuit described in U.S. Pat. No. 9,660,606 includes a first metal trace having a first end and a second end. The first end of the first metal trace is connected to a voltage source, and the second end of the first metal trace is connected to an output of a power amplifier. The matching circuit described in U.S. Pat. No. 9,660,606 further includes a second metal trace having a third end and a fourth end. The third end of the second metal trace is connected to the second end of the first metal trace. The fourth end of the second metal trace is connected to an output terminal. The first metal trace is connected in parallel to a capacitor.

However, the matching circuit described in U.S. Pat. No. 9,660,606 fails to control the second-harmonic impedance at the output of the power amplifier, and may reduce the efficiency of a power amplifier circuit.

BRIEF SUMMARY

The present disclosure improves the efficiency of a power amplifier circuit.

According to embodiments of the present disclosure, a matching circuit includes an input terminal configured to receive an amplified signal from a power amplifier, an output terminal, a first inductor having a first end connected to the input terminal, and a second end connected to the output terminal, a first capacitor connected in parallel to the first inductor, a second inductor having a first end connected to the input terminal, and a second end connected to ground, and a first series resonant circuit connected in parallel to the second inductor.

According to embodiments of the present disclosure, a matching circuit according to the present disclosure is a matching circuit between a first power amplifier and a second power amplifier. The matching circuit includes an input terminal configured to receive an amplified signal from the first power amplifier, an output terminal, a tenth inductor having a first end connected to the input terminal, and a second end connected to the output terminal, a seventh capacitor connected in parallel to the tenth inductor, and an eleventh inductor having a first end connected to the output terminal, and a second end connected to ground.

According to embodiments of the present disclosure, it is possible to provide a matching circuit that improves the efficiency of a power amplifier circuit.

Other features, elements, characteristics and advantages of the present disclosure will become more apparent from the following detailed description of embodiments of the present disclosure with reference to the attached drawings.

DETAILED DESCRIPTION

The following describes embodiments of the present disclosure with reference to the drawings. Circuit elements given the same numerals represent the same or substantially the same circuit elements, and a redundant description thereof is omitted here.

Configuration of Power Amplifier Circuit 100 According to First Embodiment

Figure 1:
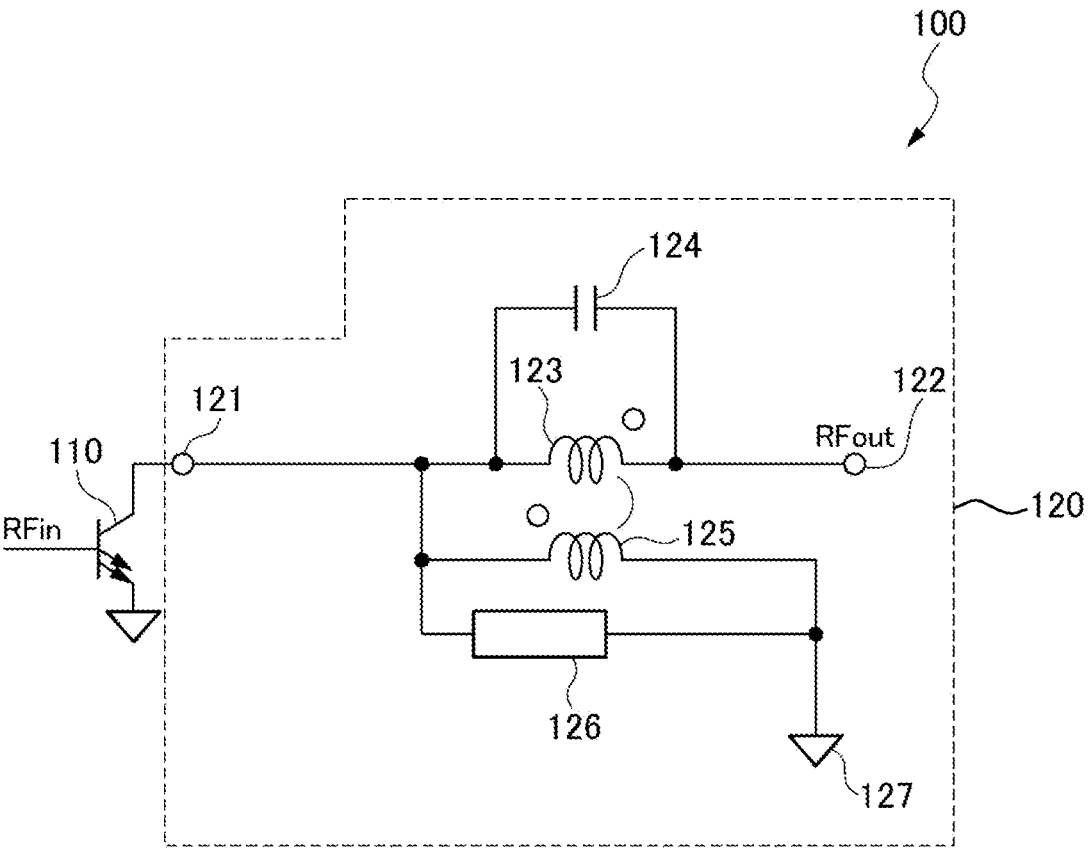
FIG. 1 is a diagram illustrating an overview of the configuration of a power amplifier circuit according to a first embodiment.

FIG. 1 is a diagram illustrating an overview of the configuration of a power amplifier circuit 100 according to a first embodiment. The power amplifier circuit 100 is mounted in, for example, a mobile communication device, such as a mobile phone and is configured to amplify the power of an input signal RFin to a level required for transmission to a base station and output the amplified input signal RFin as an output signal RFout. The input signal RFin is a radio-frequency (RF) signal modulated by, for example, a radio frequency integrated circuit (RFIC) or the like in accordance with a predetermined communication method. The input signal RFin complies with a communication standard, examples of which include the second-generation mobile communication system (2G), the third-generation mobile communication system (3G), the fourth-generation mobile communication system (4G), the fifth-generation mobile communication system (5G), Long Term Evolution Frequency Division Duplex (LTE-FDD), LTE Time Division Duplex (LTE-TDD), LTE-Advanced, and LTE-Advanced Pro. The input signal RFin has a frequency in the range of, for example, about several hundreds of megahertz (MHz) to about several tens of gigahertz (GHz). The communication standard and frequency of the input signal RFin are not limited to those described above.

The power amplifier circuit 100 includes, for example, a power amplifier 110 and a matching circuit 120.

The power amplifier 110 amplifies an input RF signal and outputs the amplified RF signal. The power amplifier 110 amplifies the input signal RFin, which is input from an input terminal through a matching circuit (not illustrated), and outputs an RF signal RF1 (amplified signal). The power amplifier 110 is constituted by, for example, a transistor, such as a heterojunction bipolar transistor (HBT). The power amplifier 110 may be constituted by a metal-oxide-semiconductor field-effect transistor instead of an HBT. In this case, "collector", "base", and "emitter" are read as "drain", "gate", and "source", respectively. In the following description, each transistor is constituted by an HBT, by way of example, unless otherwise noted.

The matching circuit 120 matches the impedance of the power amplifier circuit 100 and the impedance of a load. Further, for example, the matching circuit 120 causes even-order harmonic load impedances to be close to zero and causes odd-order harmonic load impedances to be close to infinity. That is, the matching circuit 120 allows the power amplifier circuit 100 to operate as a class-F power amplifier. The matching circuit 120 will be described in detail hereinafter.

Configuration of Matching Circuit 120

As illustrated in FIG. 1, the matching circuit 120 includes an input terminal 121 configured to receive from the power amplifier 110 an RF signal obtained by amplifying the input signal RFin, and an output terminal 122 configured to output the output signal RFout.

The matching circuit 120 includes, for example, an inductor 123 having a first end connected to the input terminal 121 and a second end connected to the output terminal 122, and a capacitor 124 connected in parallel to the inductor 123 to cause the third-harmonic load impedance to be close to infinity. As used herein, the term "infinity" is defined as an impedance that is, for example, approximately three or more times as much as the load impedance at the fundamental frequency.

The matching circuit 120 further includes, for example, an inductor 125 having a first end connected to the input terminal 121 and a second end connected to a predetermined potential 127, and a resonant circuit 126 connected in parallel to the inductor 125. The inductor 125 is desirably arranged so as to be magnetically coupled to the inductor 123, for example. This arrangement allows the matching circuit 120 to adjust the load impedance at the fundamental frequency.

The resonant circuit 126 is, for example, a series resonant circuit and is configured to cause the second-harmonic load impedance to be close to zero. As used herein, the term "zero" is defined as an impedance that is, for example, approximately one-third the load impedance at the fundamental frequency.

The predetermined potential 127 connected to the second end of the inductor 125 is desirably different from a power supply potential to be supplied to the power amplifier 110 and is ground, for example.

The predetermined potential 127 connected to the second end of the inductor 125 may be a power supply potential to be supplied to the power amplifier 110. In this case, with the power supply potential, the power amplifier 110 supplies a variable power supply voltage Vcc, which is controlled in accordance with the envelope of the RF signal, to the power amplifier circuit 100.

In the following description, the predetermined potential is "ground" or a "reference potential".

Operation of Matching Circuit 120

Figure 2A:
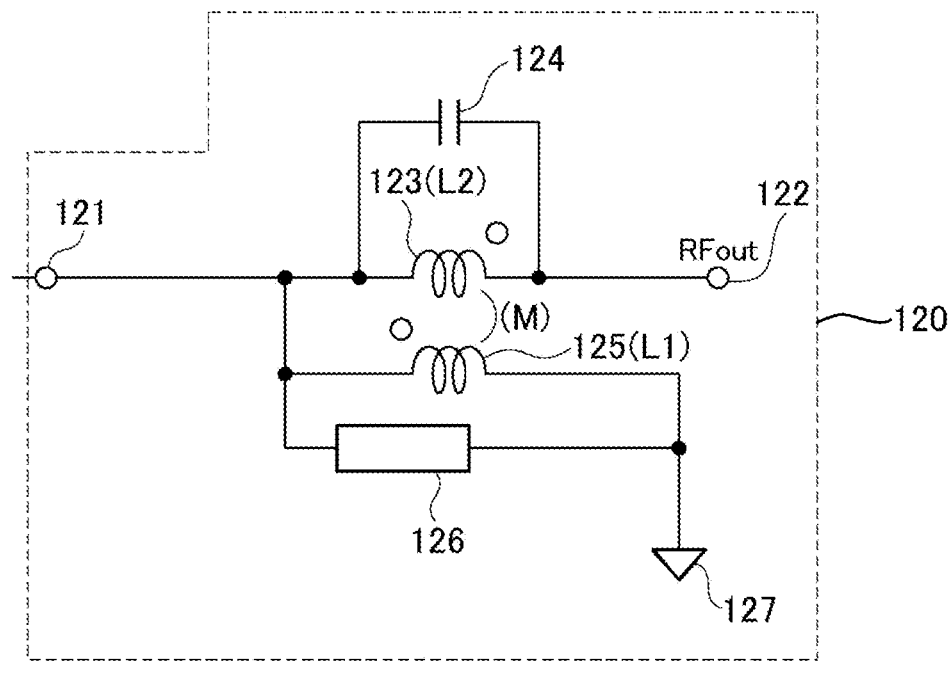
FIG. 2A is a diagram illustrating an overview of a matching circuit.
Figure 2B:
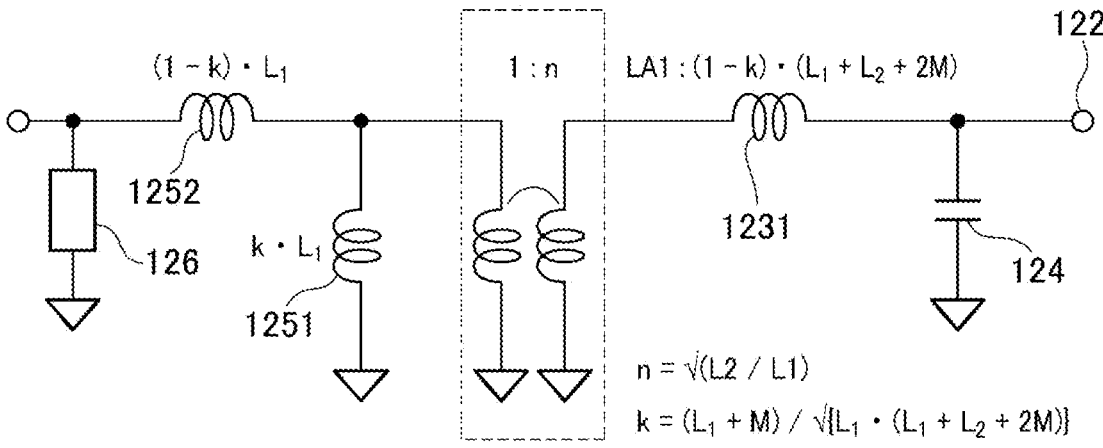
FIG. 2B is a diagram illustrating of an equivalent circuit of the matching circuit.
Figure 3:
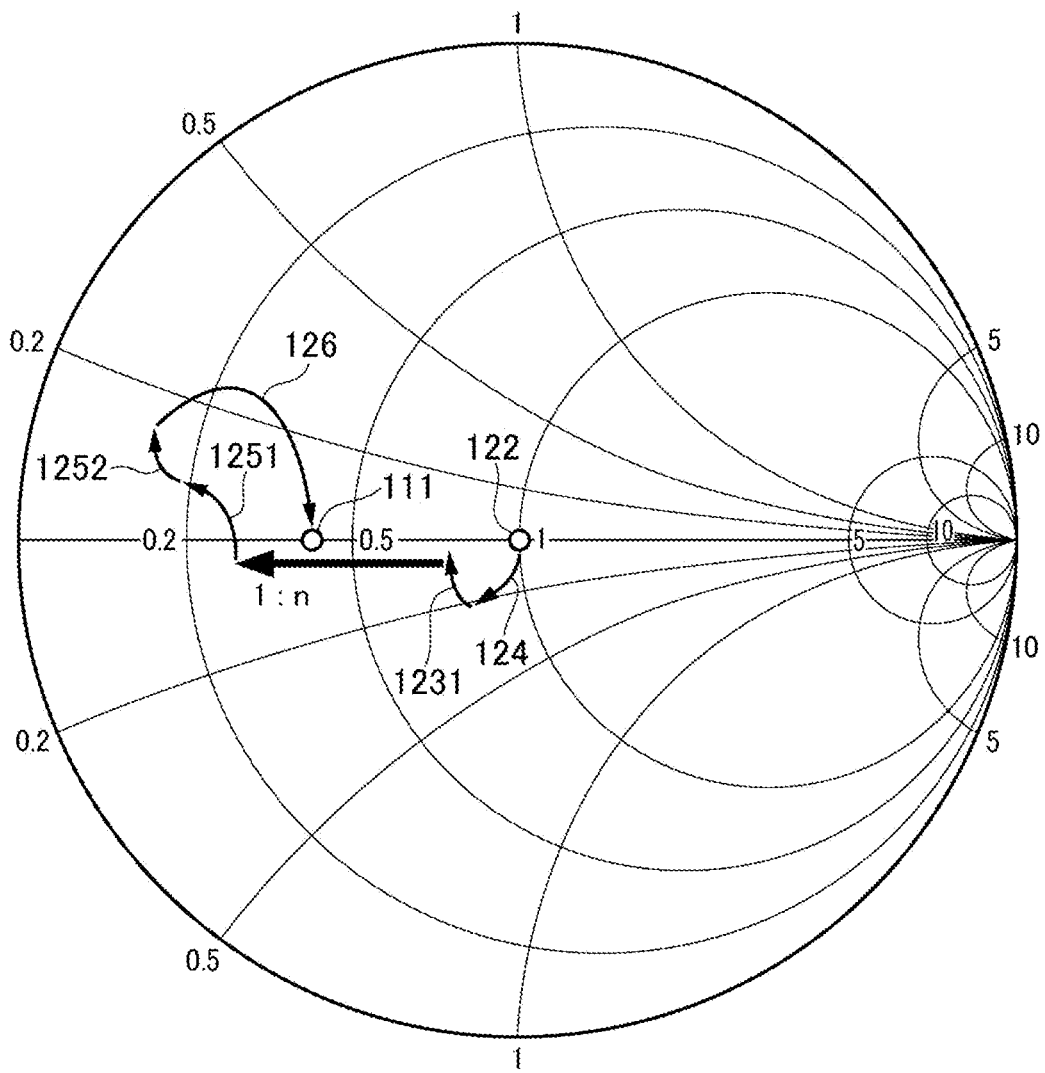
FIG. 3 is a Smith chart for the matching circuit at the fundamental frequency.

The operation of the matching circuit 120 will be described with reference to FIGS. 2A, 2B, and 3. FIG. 2A is a diagram illustrating an overview of the matching circuit 120. FIG. 2B is a diagram illustrating an equivalent circuit of the matching circuit 120. FIG. 3 is a Smith chart for the matching circuit 120 at the fundamental frequency.

The matching circuit 120 illustrated in FIG. 2A can be represented by the equivalent circuit illustrated in FIG. 2B. Referring to this equivalent circuit, the impedance operation of the matching circuit 120 at the fundamental frequency of the matching circuit 120 will be described.

In FIG. 3, in one example, a load impedance of 50 ohms is connected to the output terminal 122, and the load impedance of the output terminal 122 seen from the input terminal 121 is 20 ohms.

As illustrated in FIG. 3, the load impedance starts at the output terminal 122, and is shifted to the capacitive side by the capacitor 124 and shifted close to the real part by an inductor 1231. The load impedance is then shifted to an impedance of $1/n^2$ by the operation of an ideal 1:n balun. Thereafter, the load impedance is shifted to the inductive side by an inductor 1251 and is further shifted to the inductive side by an inductor 1252. Then, the load impedance is brought back to near the real part by the resonant circuit 126.

The resonant circuit 126 is a series resonant circuit constituted by an inductor and a capacitor and is configured to cause the second-harmonic load impedance to be close to zero.

A circuit formed by the inductor 123 and the capacitor 124 causes the third-harmonic load impedance of the output terminal 122 seen from the input terminal 121 to be close to infinity.

This allows the power amplifier circuit 100 to approximately achieve class-F operation without necessarily affecting the fundamental frequency, thus achieving improved power efficiency.

Power Amplifier Circuit 200 According to Second Embodiment

Figure 4:
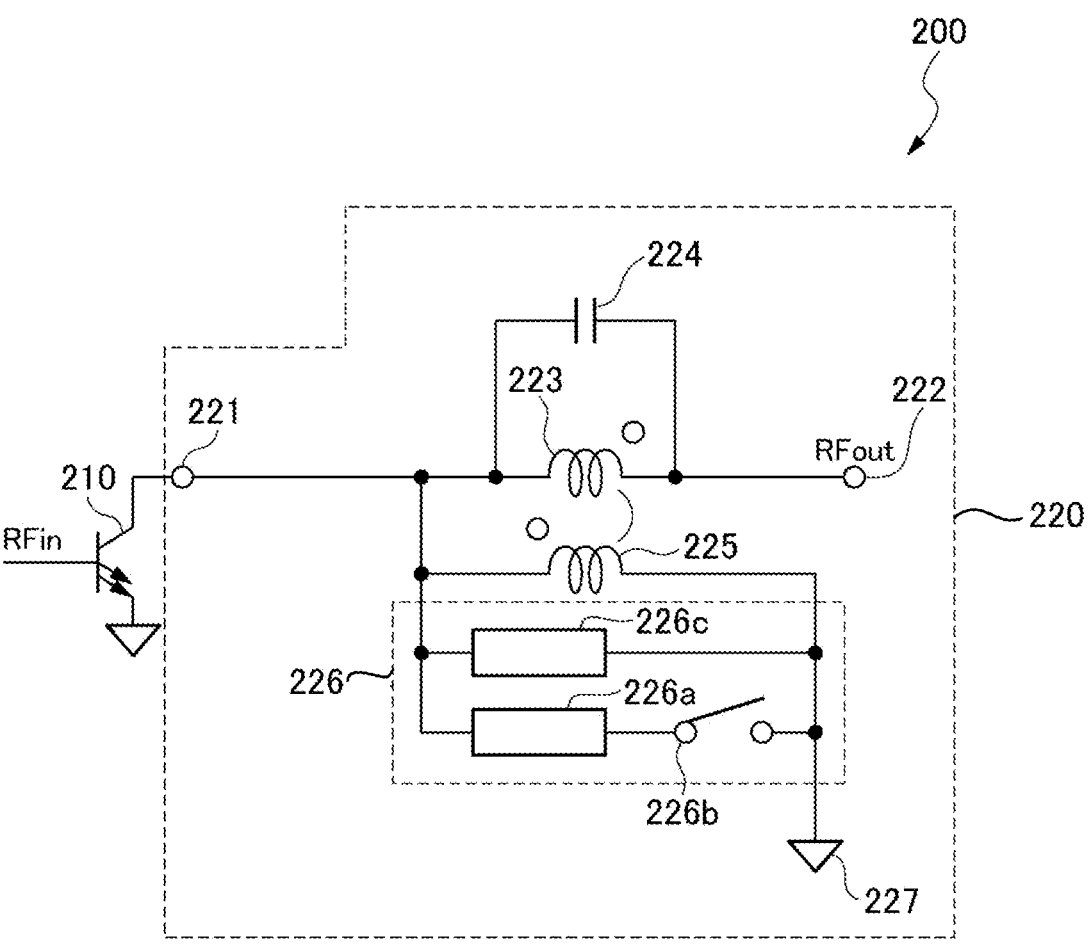
FIG. 4 is a diagram illustrating an example configuration of a power amplifier circuit according to a second embodiment.

FIG. 4 is a diagram illustrating an example configuration of a power amplifier circuit 200 according to a second embodiment. Features of the power amplifier circuit 200 according to the second embodiment common to those of the power amplifier circuit 100 according to the first embodiment described above will not be described, and only differences will be described. Further, similar operations and effects achieved with similar configurations will not be described again. The same applies to power amplifier circuits 300, 400, 500, 600, 700, 800, and 900 according to the subsequent embodiments.

As illustrated in FIG. 4, the power amplifier circuit 200 includes a matching circuit 220. Unlike the matching circuit 120, the matching circuit 220 includes a resonant circuit 226 including a first resonant circuit 226a, a switch 226b, and a second resonant circuit 226c, instead of the resonant circuit 126.

The first resonant circuit 226a is, for example, a series resonant circuit and is configured to cause the second-harmonic load impedance to be close to zero at the fundamental frequency.

The switch 226b is connected in series with the first resonant circuit 226a.

The second resonant circuit 226c is connected in parallel to the first resonant circuit 226a and the switch 226b. The second resonant circuit 226c is, for example, a series resonant circuit and is configured to cause the second-harmonic load impedance to be close to zero at a frequency different from the fundamental frequency.

When the switch 226b is off, the matching circuit 220 causes the second-harmonic load impedance of an output terminal 222 seen from an input terminal 221 to be close to zero in a predetermined frequency band. When the switch 226b is turned on, on the other hand, the matching circuit 220 causes the second-harmonic load impedance of the output terminal 222 seen from the input terminal 221 to be close to zero in a frequency band different from the predetermined frequency band.

The matching circuit 220 can therefore increase the bandwidth of the power amplifier circuit 200.

Power Amplifier Circuit 300 According to Third Embodiment

Figure 5:
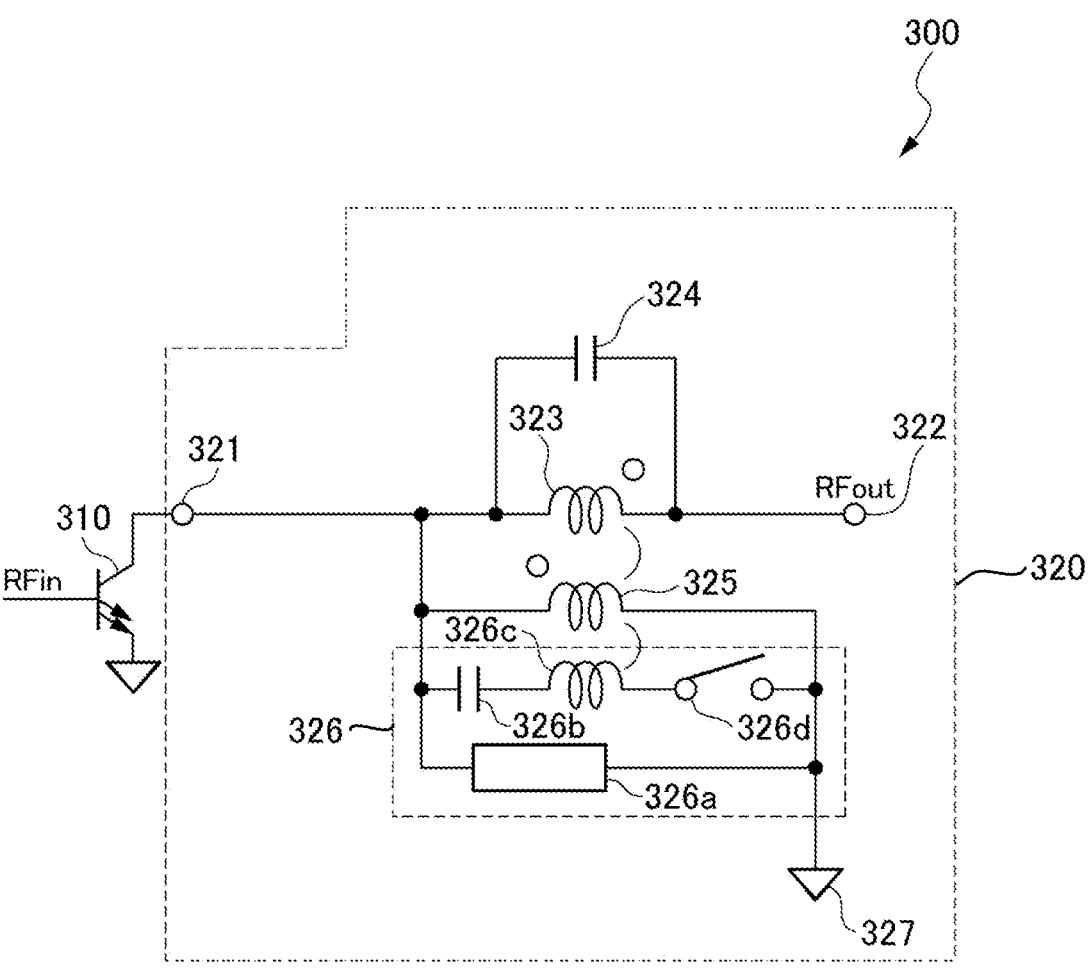
FIG. 5 is a diagram illustrating an example configuration of a power amplifier circuit according to a third embodiment.

FIG. 5 is a diagram illustrating an example configuration of a power amplifier circuit 300 according to a third embodiment.

As illustrated in FIG. 5, the power amplifier circuit 300 includes a matching circuit 320. Unlike the matching circuit 120, the matching circuit 320 includes a resonant circuit 326 including a resonant circuit 326a, a capacitor 326b, an inductor 326c, and a switch 326d. The capacitor 326b, the inductor 326c, and the switch 326d are connected in parallel to the resonant circuit 326a.

The resonant circuit 326a is, for example, a series resonant circuit and is configured to cause the second-harmonic load impedance to be close to zero.

The capacitor 326b, the inductor 326c, and the switch 326d are connected in series with each other.

The inductor 326c is desirably arranged so as to be magnetically coupled to at least one of an inductor 323 or an inductor 325. In this case, when the switch 326d is turned on, current flows through the inductor 326c, and the inductance value of the inductor 323 or the inductor 325 magnetically coupled to the inductor 326c changes. Accordingly, the matching circuit 320 can adjust the load impedance of an output terminal 322 seen from an input terminal 321 at the fundamental frequency. Moreover, the adjustment using magnetic coupling is achieved when the load impedance changes in response to the switch 326d being turned on or off and the second-harmonic load impedance occurs.

Power Amplifier Circuit 400 According to Fourth Embodiment

Figure 6:
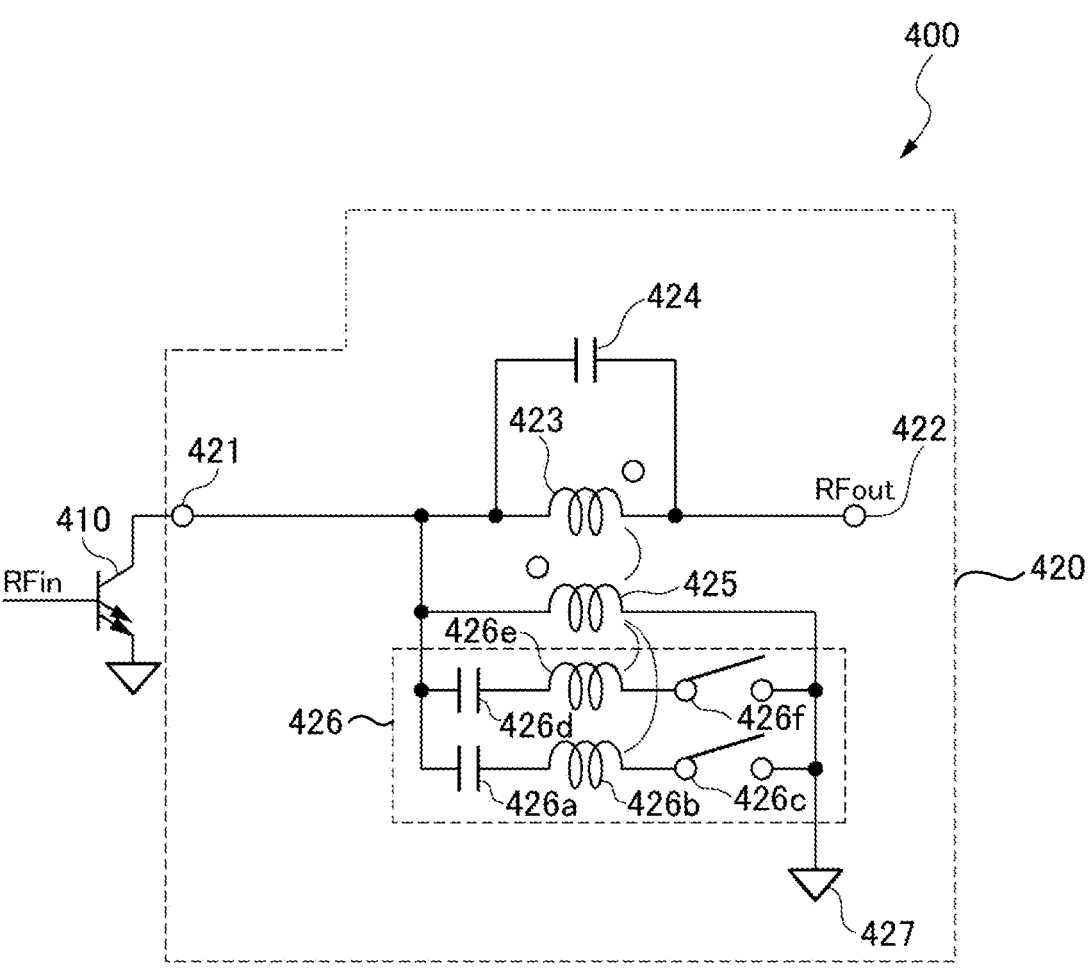
FIG. 6 is a diagram illustrating an example configuration of a power amplifier circuit according to a fourth embodiment.

FIG. 6 is a diagram illustrating an example configuration of a power amplifier circuit 400 according to a fourth embodiment.

As illustrated in FIG. 6, the power amplifier circuit 400 includes a matching circuit 420. Unlike the matching circuit 320, the matching circuit 420 includes a resonant circuit 426 including a capacitor 426a, an inductor 426b, a switch 426c, a capacitor 426d, an inductor 426e, and a switch 426f. The capacitor 426a, the inductor 426b, and the switch 426c are disposed instead of the resonant circuit 326a.

The inductor 426b is desirably arranged so as to be magnetically coupled to at least one of an inductor 423 or an inductor 425. In this case, when the switch 426c is turned on, current flows through the inductor 426b, and the inductance value of the inductor 423 or the inductor 425 magnetically coupled to the inductor 426b changes.

Accordingly, the switch 426c is turned on or off to selectively adjust the value of the load impedance of an output terminal 422 seen from an input terminal 421 at the fundamental frequency. That is, the inductor 426b, which is magnetically coupled to at least one of the inductor 423 or the inductor 425, can cause the second-harmonic load impedance to be close to zero and also adjust the impedance at the fundamental frequency.

Power Amplifier Circuit 500 According to Fifth Embodiment

Figure 7:
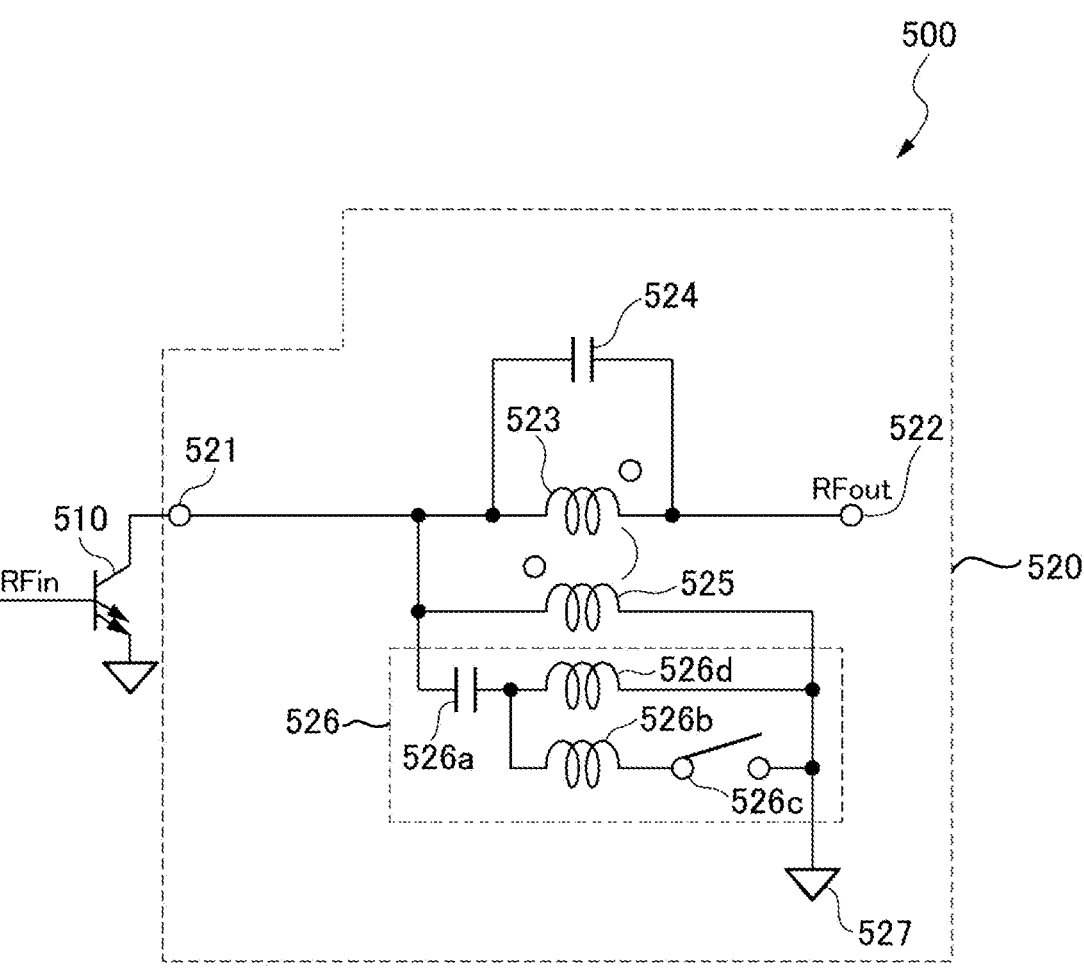
FIG. 7 is a diagram illustrating an example configuration of a power amplifier circuit according to a fifth embodiment.

FIG. 7 is a diagram illustrating an example configuration of a power amplifier circuit 500 according to a fifth embodiment.

As illustrated in FIG. 7, the power amplifier circuit 500 includes a matching circuit 520. Unlike the matching circuit 120, the matching circuit 520 includes a resonant circuit 526 including a capacitor 526a, inductors 526b and 526d, and a switch 526c, instead of the resonant circuit 126.

The capacitor 526a has a first end connected to an input terminal 521 of the matching circuit 520.

The inductor 526b has a first end connected to a second end of the capacitor 526a and a second end connected to the switch 526c.

The switch 526c has a first end connected to the second end of the inductor 526b and a second end connected to ground 527.

The inductor 526d has a first end connected to the second end of the capacitor 526a and a second end connected to the ground 527. That is, the inductor 526d is connected in parallel to the inductor 526b and the switch 526c.

When the switch 526c is off, the matching circuit 520 causes the second-harmonic load impedance of an output terminal 522 seen from the input terminal 521 to be close to zero in a predetermined frequency band. When the switch 526c is turned on, on the other hand, the matching circuit 520 causes the second-harmonic load impedance of the output terminal 522 seen from the input terminal 521 to be close to zero in a frequency band different from the predetermined frequency band.

The matching circuit 520 can therefore increase the bandwidth of the power amplifier circuit 500.

Power Amplifier Circuit 600 According to Sixth Embodiment

Figure 8:
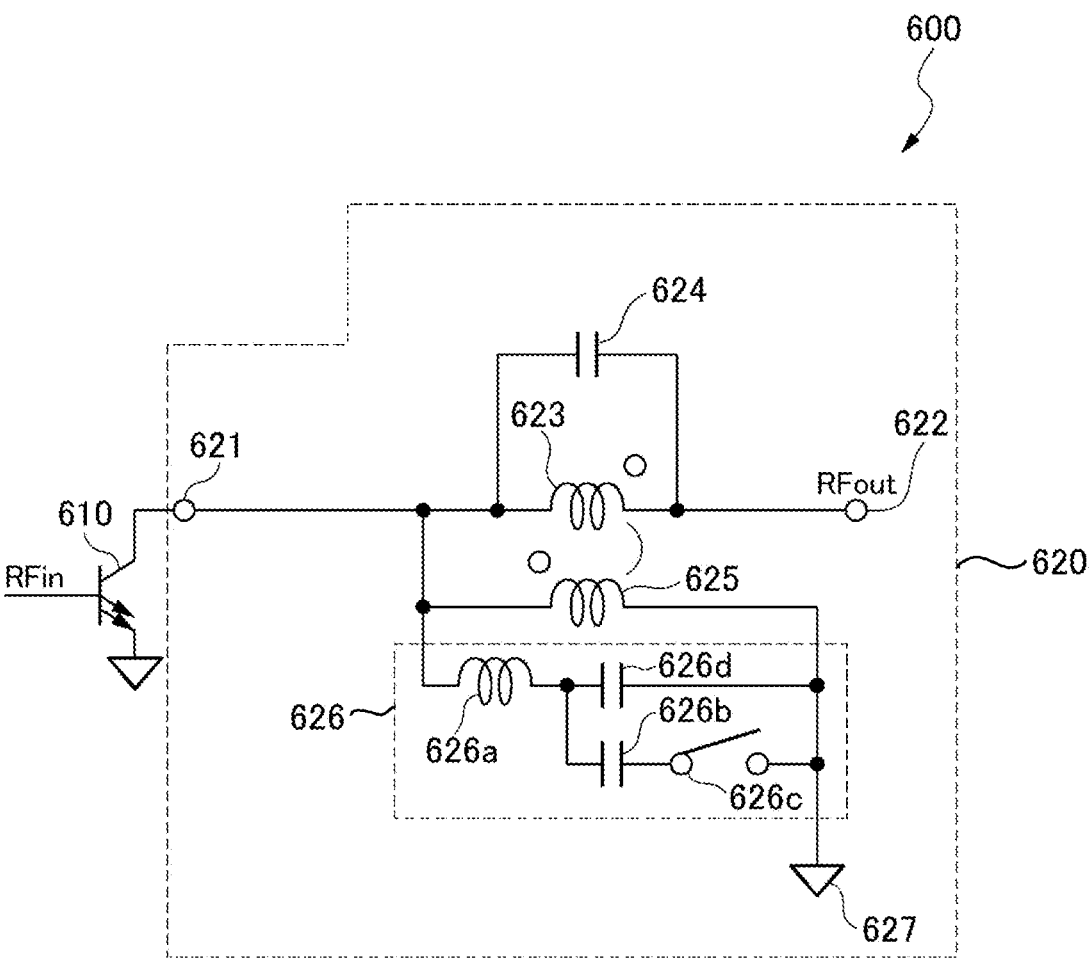
FIG. 8 is a diagram illustrating an example configuration of a power amplifier circuit according to a sixth embodiment.

FIG. 8 is a diagram illustrating an example configuration of a power amplifier circuit 600 according to a sixth embodiment.

As illustrated in FIG. 8, the power amplifier circuit 600 includes a matching circuit 620. The matching circuit 620 includes a resonant circuit 626. Unlike a resonant circuit 526 of the matching circuit 520, the resonant circuit 626 includes an inductor 626a instead of the capacitor 526a, capacitors 626b and 626d instead of the inductors 526b and 526d, respectively, and a switch 626c.

Like the power amplifier circuit 500 according to the fifth embodiment, the matching circuit 620 can therefore increase the bandwidth of the power amplifier circuit 600.

Power Amplifier Circuit 700 According to Seventh Embodiment

Figure 9:
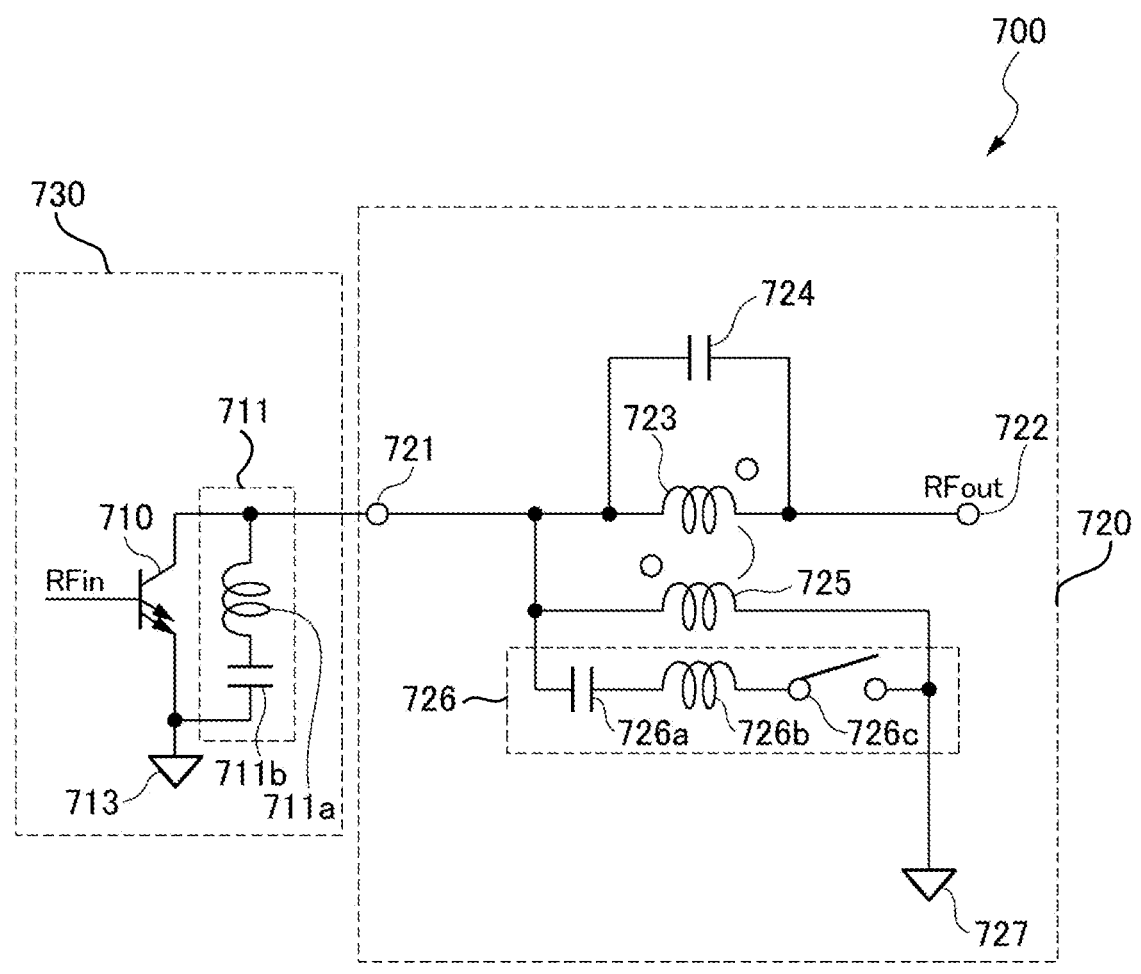
FIG. 9 is a diagram illustrating an example configuration of a power amplifier circuit according to a seventh embodiment.

FIG. 9 is a diagram illustrating an example configuration of a power amplifier circuit 700 according to a seventh embodiment.

As illustrated in FIG. 9, unlike the power amplifier circuits 100, 200, 300, 400, 500, and 600, the power amplifier circuit 700 includes a power amplifier 710 having an emitter and a collector connected to a series resonant circuit 711 constituted by an inductor 711a and a capacitor 711b. The emitter of the power amplifier 710 and the series resonant circuit 711 are connected to common ground 713. For example, the series resonant circuit 711 and the power amplifier 710 are formed on a semiconductor substrate 730.

A specific description will be given of an example connection relationship among elements. A first end of the inductor 711a is connected to the collector of the power amplifier 710, and a second end of the inductor 711a is connected to a first end of the capacitor 711b. A second end of the capacitor 711b is connected to the emitter of the power amplifier 710. The emitter of the power amplifier 710 and the second end of the capacitor 711b are connected to the ground 713.

In FIG. 9, in one example, a matching circuit 720 includes a resonant circuit 726 including a capacitor 726a, an inductor 726b, and a switch 726c that are connected in series with each other. However, the configuration of the resonant circuit 726 is not limited to the illustrated one and may be, for example, any one of the resonant circuits 126, 226, 326, 426, 526, and 626 illustrated in FIGS. 1 and 4 to 8.

In the power amplifier circuit 700 according to the seventh embodiment, when the switch 726c is off, the series resonant circuit 711 causes the second-harmonic load impedance of an output terminal 722 seen from an input terminal 721 to be close to zero in a predetermined frequency band. In the power amplifier circuit 700, when the switch 726c is turned on, on the other hand, the second-harmonic load impedance of the output terminal 722 seen from the input terminal 721 is caused to be close to zero in a frequency band different from the predetermined frequency band. That is, the power amplifier circuit 700 can cause the load impedances to be close to zero in two frequency bands.

Since the series resonant circuit 711 is connected to the emitter of the power amplifier 710 and the ground 713, the capacitance of the capacitor 711b can be increased even when the power amplifier circuit 700 has a high operating frequency. This is because the connection of the series resonant circuit 711 to the emitter of the power amplifier 710 and the ground 713 can eliminate or mitigate the effect of the parasitic inductor that exist between ground 727 and the ground 713.

Specific issues caused when the operating frequency is high will be described using the power amplifier circuit 500 illustrated in FIG. 7 as an example. As illustrated in FIG. 7, with wiring routed across a substrate, a parasitic inductor is connected between the ground 527 of the resonant circuit 526 and ground connected to the emitter of a power amplifier 510. When the power amplifier circuit 500 has a high operating frequency, the capacitance of the capacitor 526a is reduced by the parasitic inductor. As a result, the bandwidth of frequencies at which the second-harmonic impedance can be reduced is narrowed.

Power Amplifier Circuit 800 According to Eighth Embodiment

Figure 10:
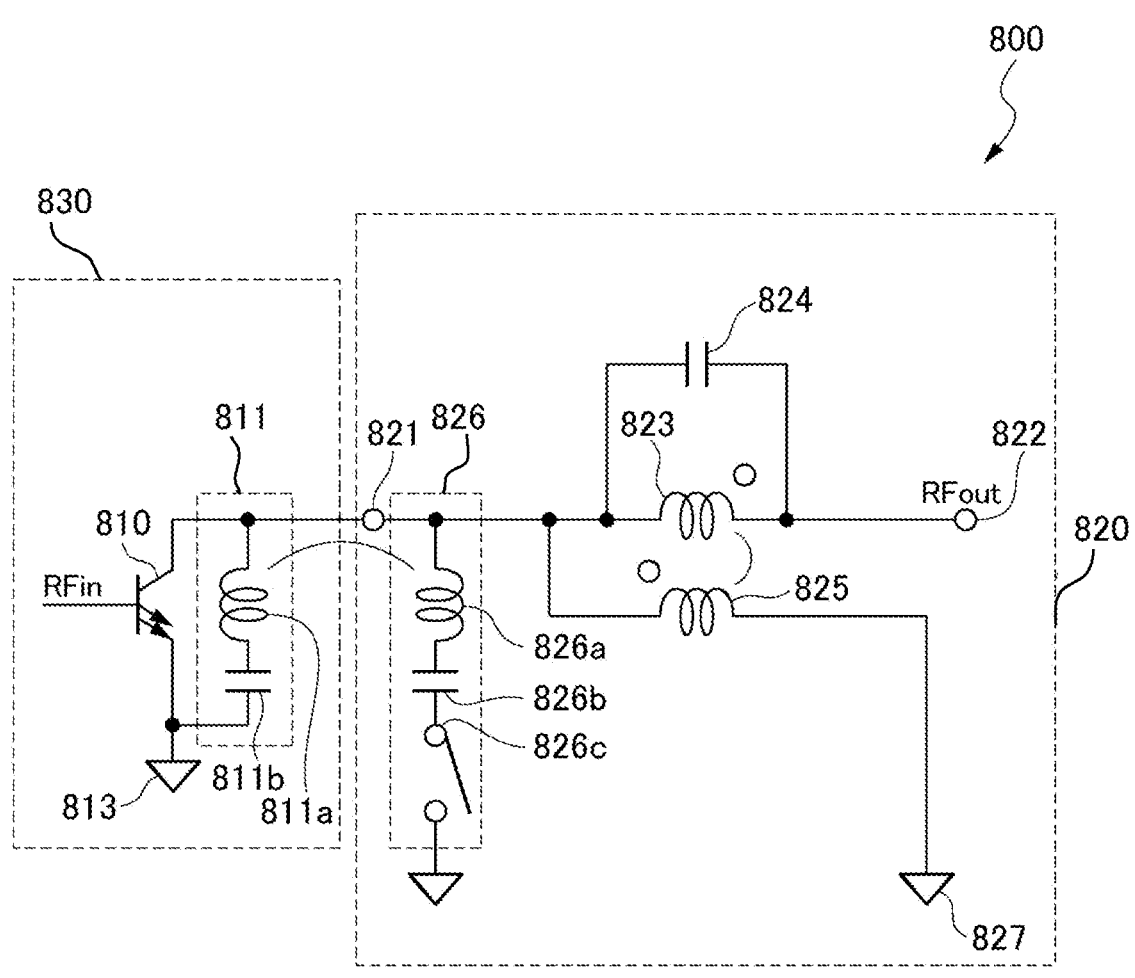
FIG. 10 is a diagram illustrating an example configuration of a power amplifier circuit according to an eighth embodiment.

FIG. 10 is a diagram illustrating an example configuration of a power amplifier circuit 800 according to an eighth embodiment.

As illustrated in FIG. 10, unlike the power amplifier circuit 700 illustrated in FIG. 9, the power amplifier circuit 800 is configured such that an inductor 811a of a series resonant circuit 811 and an inductor 826a of a resonant circuit 826 are magnetically coupled to each other.

In the power amplifier circuit 800 according to the eighth embodiment, a switch 826c of the resonant circuit 826 is turned on or off to change the inductance value of the inductor 811a. As a result, the resonant frequency of the series resonant circuit 811, which is constituted by the inductor 811a and a capacitor 811b on a substrate 830, can be adjusted.

Power Amplifier Circuit 900 According to Ninth Embodiment

Figure 11:
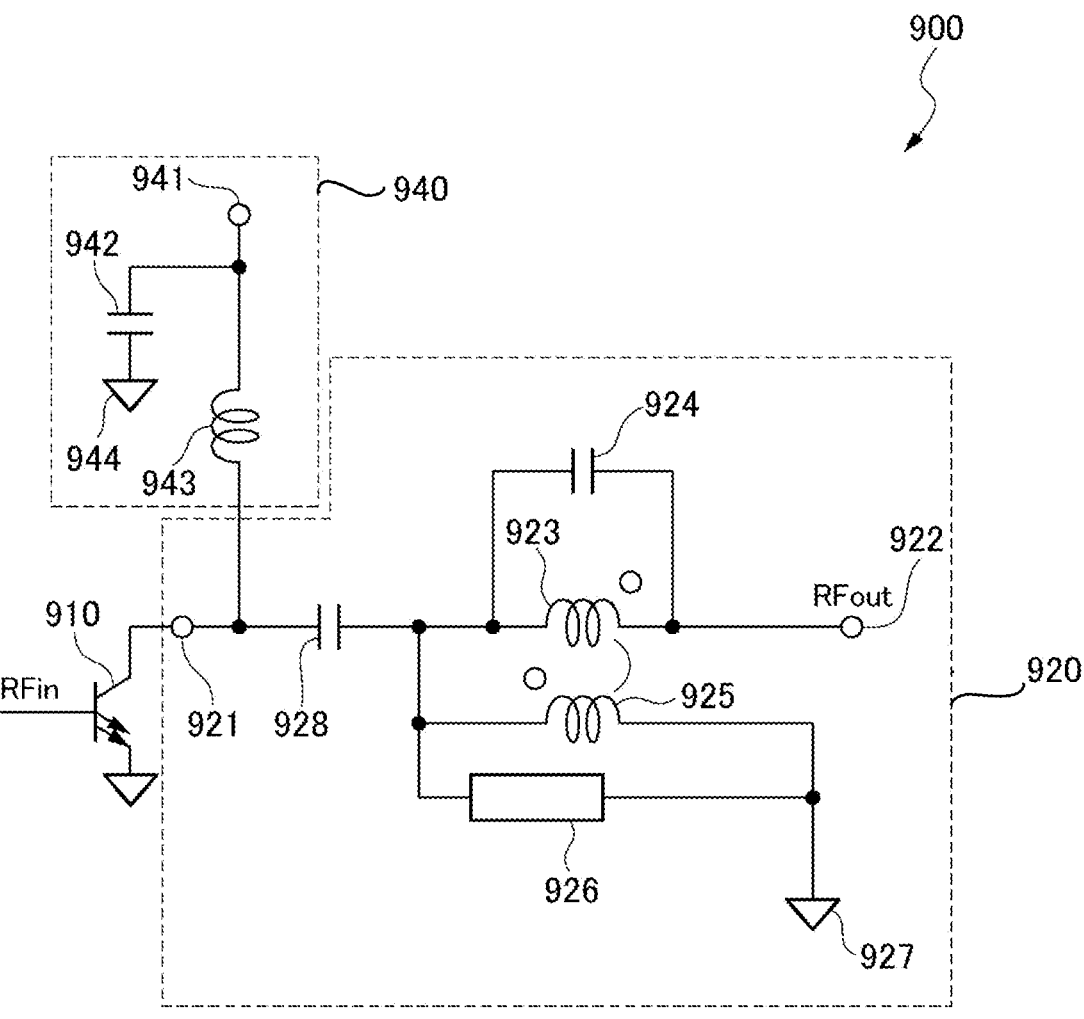
FIG. 11 is a diagram illustrating an example configuration of a power amplifier circuit according to a ninth embodiment.

FIG. 11 is a diagram illustrating an example configuration of a power amplifier circuit 900 according to a ninth embodiment.

As illustrated in FIG. 11, unlike the power amplifier circuit 100 illustrated in FIG. 1, the power amplifier circuit 900 includes a direct-current (DC) power feed terminal 941 for feeding power to a power amplifier 910.

Specifically, the DC power feed terminal 941 is connected to ground 944 through a shunt capacitor 942 for removing high-frequency components. The DC power feed terminal 941 is connected to a first end of a DC-cut capacitor 928 through an inductor 943. The first end of the capacitor 928 is connected to an input terminal 921. Further, the capacitor 928 is connected in series with an inductor 923 and an inductor 925. The inductor 923 and the inductor 925 correspond to the inductor 123 and the inductor 125 according to the first embodiment, respectively. In the power amplifier circuit 900 according to the ninth embodiment, a predetermined potential 927 connected to a resonant circuit 926 is ground.

In FIG. 11, the resonant circuit 926 in the power amplifier circuit 900 according to the ninth embodiment has a configuration similar to that of the resonant circuit 126 illustrated in FIG. 1. However, this is not limiting. For example, the resonant circuit 926 may be any of the resonant circuits 426, 526, 626, 726, and 826, respectively illustrated in FIGS. 4 to 8, and the advantages achieved by the resonant circuits 426, 526, 626, 726, and 826 are similar to each other.

Power Amplifier Circuit 1000 According to Tenth Embodiment

Figure 12:
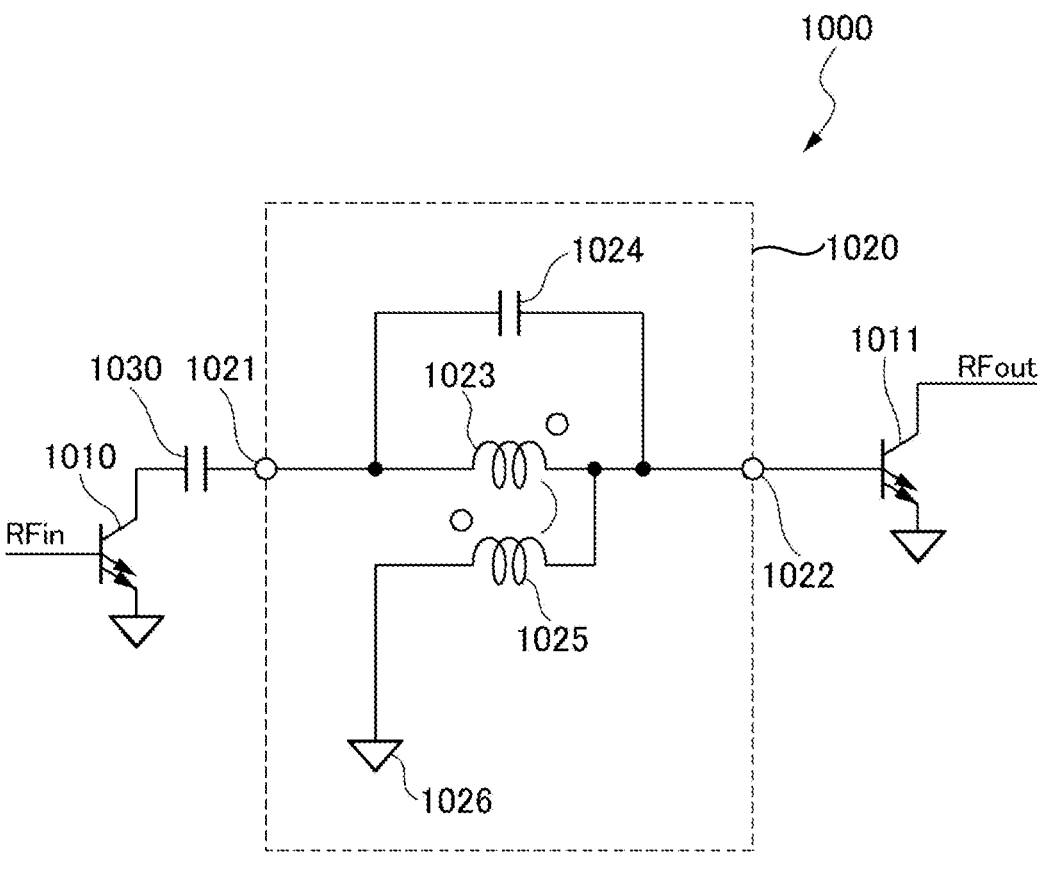
FIG. 12 is a diagram illustrating an example configuration of a power amplifier circuit according to a tenth embodiment.

The configuration of a power amplifier circuit 1000 according to a tenth embodiment will be described with reference to FIG. 12. FIG. 12 is a diagram illustrating an example configuration of the power amplifier circuit 1000 according to the tenth embodiment.

As illustrated in FIG. 12, unlike the power amplifier circuit 100 illustrated in FIG. 1, the power amplifier circuit

1000 includes a driver-stage power amplifier (hereinafter referred to as "driver amplifier 1010"), an output-stage power amplifier (hereinafter referred to as "output amplifier 1011"), and a matching circuit 1020 between the driver amplifier 1010 and the output amplifier 1011. Unlike the matching circuit 120 of the power amplifier circuit 100, for example, the matching circuit 1020 is configured to cause the second-harmonic load impedance to be close to infinity. The power amplifier circuit 1000 includes, for example, a capacitor 1030 between the driver amplifier 1010 and the matching circuit 1020. The capacitor 1030 is configured to, for example, cut the DC component. The capacitor 1030 is further configured to adjust, for example, the fundamental component of the load impedance of the driver amplifier 1010.

As illustrated in FIG. 12, the matching circuit 1020 includes an input terminal 1021 configured to receive from the driver amplifier 1010 an RF signal obtained by amplifying an input signal RFin, and an output terminal 1022 configured to output an output signal RFout to the output amplifier 1011. The matching circuit 1020 includes, for example, an inductor 1023 having a first end connected to the input terminal 1021 and a second end connected to the output terminal 1022, and a capacitor 1024 connected in parallel to the inductor 1023. The matching circuit 1020 is configured to cause, for example, the second-harmonic load impedance to be close to infinity by using the inductor 1023 and the capacitor 1024. In this embodiment, the inductor 1023 and the capacitor 1024 set the second-harmonic load impedance to infinity. Alternatively, the nth-order harmonic load impedance may be set to infinity, where n is a natural number greater than or equal to 2.

The matching circuit 1020 further includes, for example, an inductor 1025 having a first end connected to the output terminal 1022 and a second end connected to ground 1026. The inductor 1025 is desirably arranged so as to be magnetically coupled to the inductor 1023, for example. The matching circuit 1020 can therefore adjust the load impedance in, for example, the frequency band of the fundamental wave.

Figure 13:
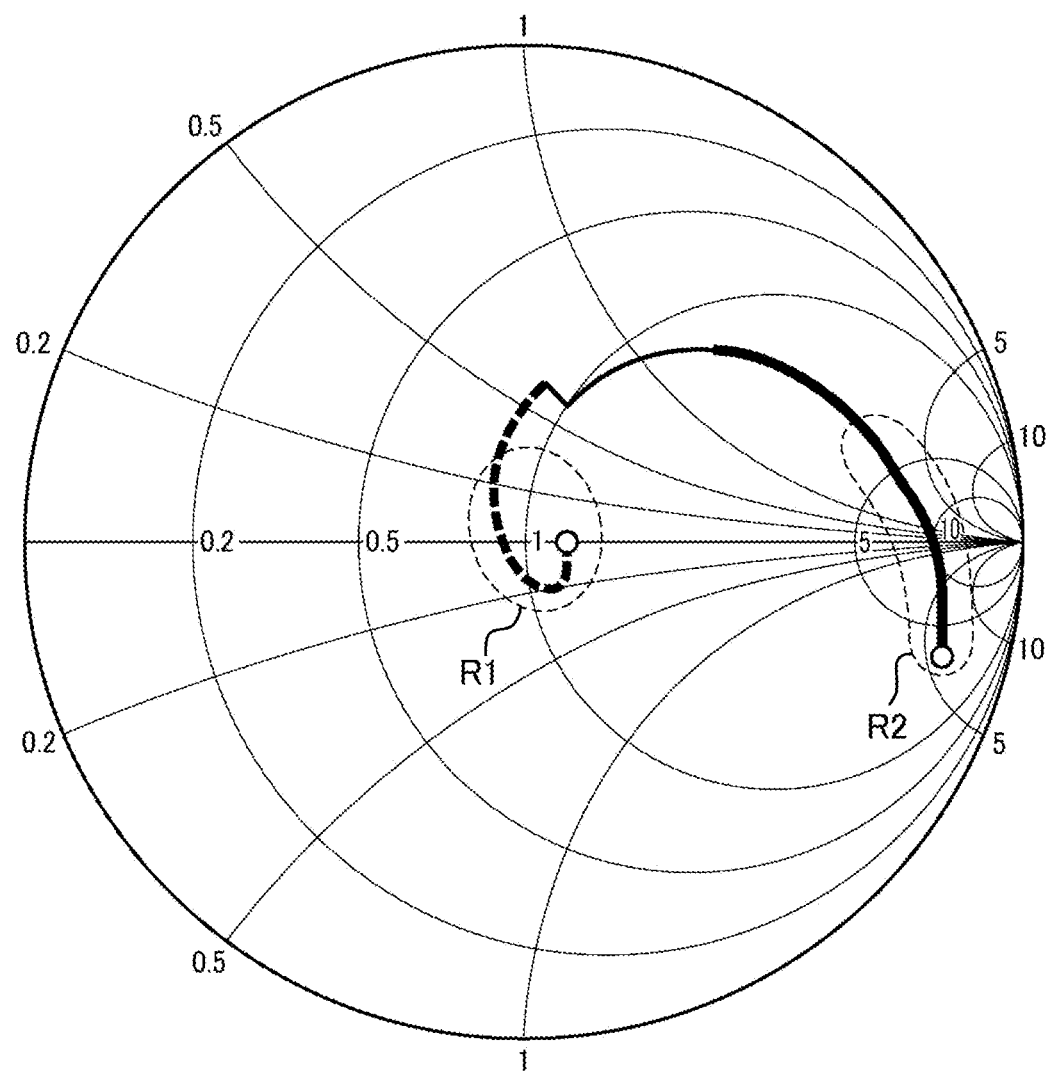
FIG. 13 is a Smith chart illustrating an example change in load impedance seen from a driver amplifier with frequency.

Next, an overview of load impedances in the frequency band of the fundamental wave and the frequency band of the second harmonic wave, seen from the driver amplifier 1010, will be described with reference to FIG. 13. FIG. 13 is a Smith chart illustrating an example change in load impedance seen from the driver amplifier 1010 with frequency. In FIG. 13, a thick broken line indicates a change in load impedance in the frequency band of the fundamental wave, and a thick solid line indicates a change in load impedance in the for the frequency band of the second harmonic wave.

FIG. 13 illustrates that the bandwidth is increased in a region R1 on the Smith chart over the frequency band of the fundamental wave. FIG. 13 also illustrates that the load impedance is close to infinity in a region R2 on the Smith chart over the frequency band of the second harmonic wave. The phrase "the load impedance is close to infinity in the region R2" indicates that, for example, the load impedance in the region R2 is about twice or more times as much as the load impedance in the region R1. In the power amplifier circuit 1000 according to the tenth embodiment, therefore, a balun formed by the inductor 1023 and the inductor 1025 can increase the bandwidth of the load impedance in the frequency band of the fundamental wave. In the power amplifier circuit 1000 according to the tenth embodiment, furthermore, a parallel resonant circuit formed by the inductor 1023 and the capacitor 1024 can cause the load impedance to be close to infinity in the frequency band of the second harmonic wave. As a result, it is possible to improve the efficiency of the power amplifier circuit 1000.

Operation of Matching Circuit 1020

Figure 14:
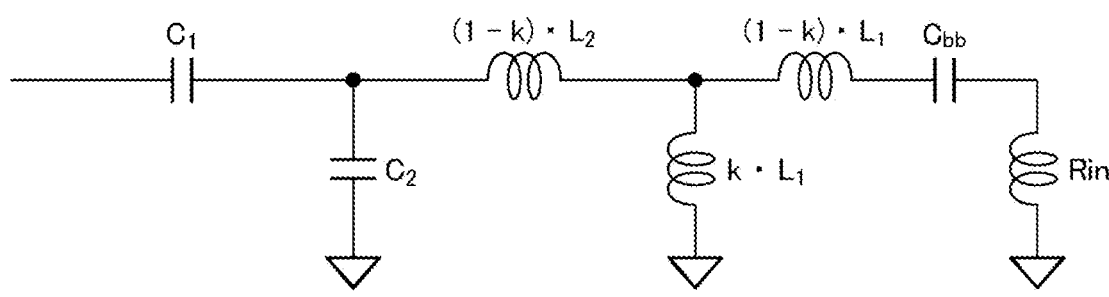
FIG. 14 is a diagram illustrating of an equivalent circuit of a matching circuit according to the tenth embodiment.
Figure 15:
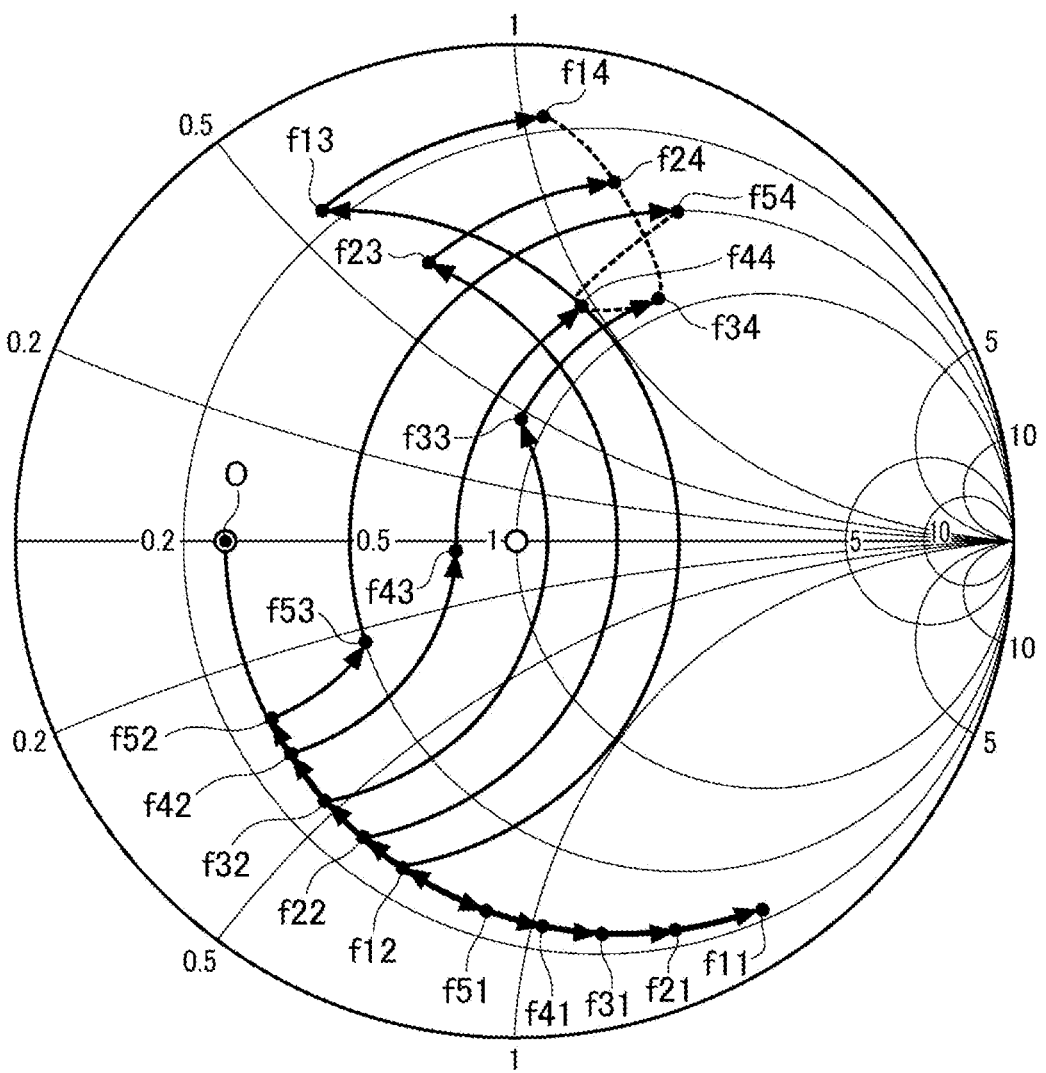
FIG. 15 is a Smith chart illustrating an example change in load impedance of the matching circuit according to the tenth embodiment in the frequency band of the fundamental wave.

Next, the operation of the matching circuit 1020 that allows for an increase in the bandwidth of the load impedance in the frequency band of the fundamental wave will be described in detail with reference to FIGS. 14 and 15. FIG. 14 is a diagram illustrating an equivalent circuit of the matching circuit 1020 according to the tenth embodiment. FIG. 15 is a Smith chart illustrating an example change in load impedance of the matching circuit 1020 according to the tenth embodiment in the frequency band of the fundamental wave.

The matching circuit 1020 illustrated in FIG. 12 can be represented by the equivalent circuit illustrated in FIG. 14. In FIG. 14, for convenience of description, the inductance of the inductor 1023 is denoted by "$L_1$", the inductance of the inductor 1025 is denoted by "$L_2$", the coupling coefficient between the inductor 1023 and the inductor 1025 is denoted by "k", the base ballast capacitance of the output amplifier 1011 is denoted by "$C_{bb}$", the capacitance of the capacitor 1024 is denoted by "$C_2$", and the capacitance of the capacitor 1030 is denoted by "$C_1$". In the equivalent circuit illustrated in FIG. 14, for example, in the matching circuit 1020, the inductance value of the inductor 1025 is small, and the impedance of the inductor 1025 seen from the output terminal 1022 is much smaller than the impedance of the output amplifier 1011 seen from the output terminal 1022 and the impedance of the inductor 1023 side seen from the output terminal 1022. Based on the equivalent circuit, the load impedance operation seen from the driver amplifier 1010 in the frequency band of the fundamental wave will be described with reference to FIG. 15.

In FIG. 15, the frequencies in the fundamental wave are denoted by a frequency f1, a frequency f2, a frequency f3, a frequency f4, and a frequency f5 in increasing order, with the frequency f1 being the lowest. In FIG. 15, for convenience of illustration, the changes in load impedance due to "$C_1$" and "$C_2$" are ignored, and the operation of a 1:n balun is ignored.

First, a change in load impedance at the frequency f1 will be described. As illustrated in FIG. 15, the load impedance starts at point O, and is shifted to point f11 by the capacitive characteristic of "$C_{bb}$", brought back to point f12 by the inductive characteristic of the series $(1-k) \cdot L_1$, shifted to point f13 by the capacitive characteristic of the parallel $k \cdot L_1$, and shifted to point f14 by the inductive characteristic of the series $(1-k) \cdot L_2$. Likewise, the load impedances at the frequencies f2 to f5 start at the point O, and are shifted from point f21 to point f24, from point f31 to point f34, from point f41 to point f44, and from point f51 to point f54, respectively. FIG. 15 indicates that connecting the points f14 to f54 in sequence results in gathering of the load impedances on the Smith chart. In this manner, as illustrated in FIG. 15, connecting the points f14 to f54 in sequence produces a roll on the Smith chart, and the load impedances are constant at the frequencies f24 to f54. Since a power amplifier exhibits broadband power characteristics when the frequency dependence of the output load impedance of the power amplifier is small, as illustrated in FIG. 15, a constant load impedance implements the broadband operation of the power amplifier. That is, in FIG. 15, in the power amplifier circuit 1000, the bandwidth of the load impedance seen from the driver amplifier 1010 in the frequency band of the fundamental wave is increased.

First Modification

Figure 16:
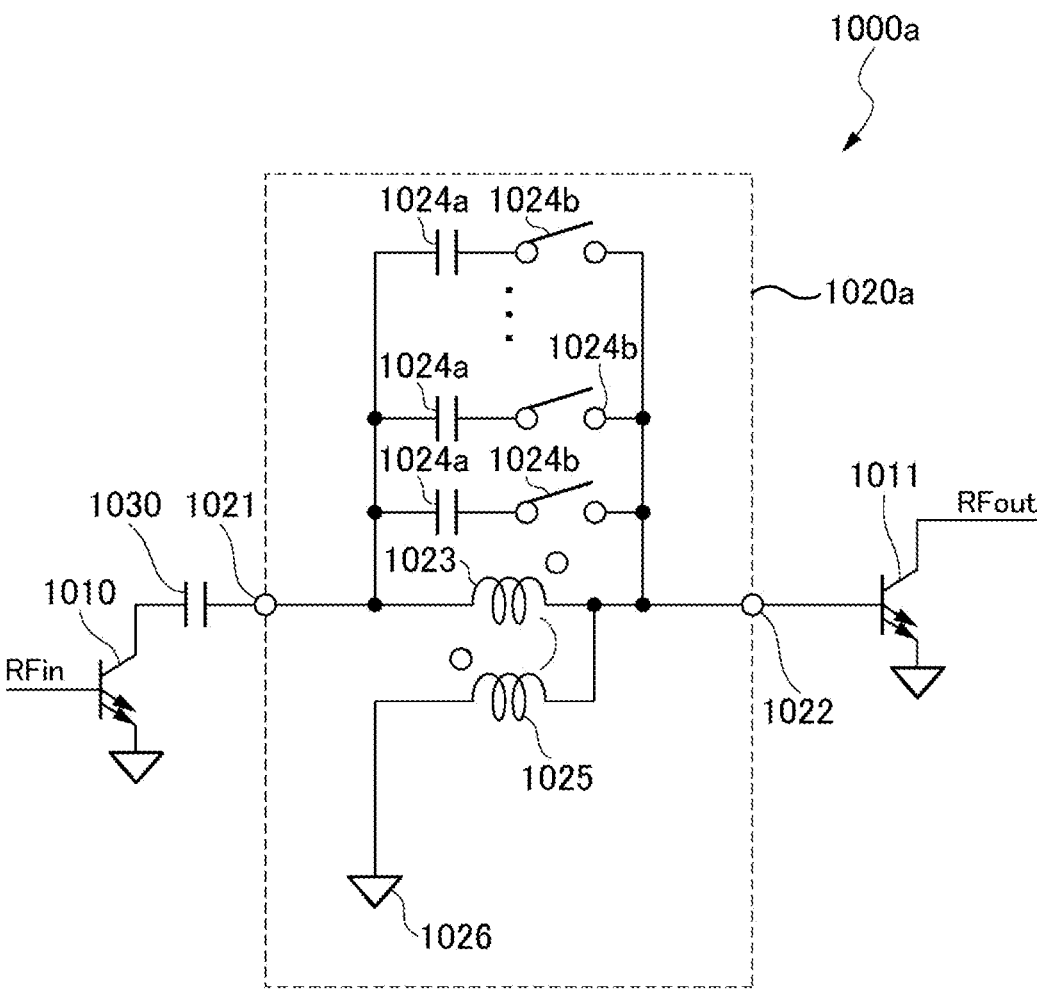
FIG. 16 is a diagram illustrating an example configuration of a first modification of the power amplifier circuit according to the tenth embodiment.

The configuration of a first modification of the power amplifier circuit 1000 according to the tenth embodiment will be described with reference to FIG. 16. FIG. 16 is a diagram illustrating an example configuration of the first modification of the power amplifier circuit 1000 according to the tenth embodiment. As illustrated in FIG. 16, a power amplifier circuit 1000a according to the first modification includes a matching circuit 1020a. Unlike the matching circuit 1020 of the power amplifier circuit 1000 illustrated in FIG. 12, the matching circuit 1020a includes a plurality of capacitors 1024a connected in parallel to the inductor 1023. Each of the capacitors 1024a is connected in series with a switch 1024b. This configuration can adjust the resonant frequency of a parallel resonant circuit formed by the inductor 1023 and the capacitors 1024a.

Second Modification

Figure 17:
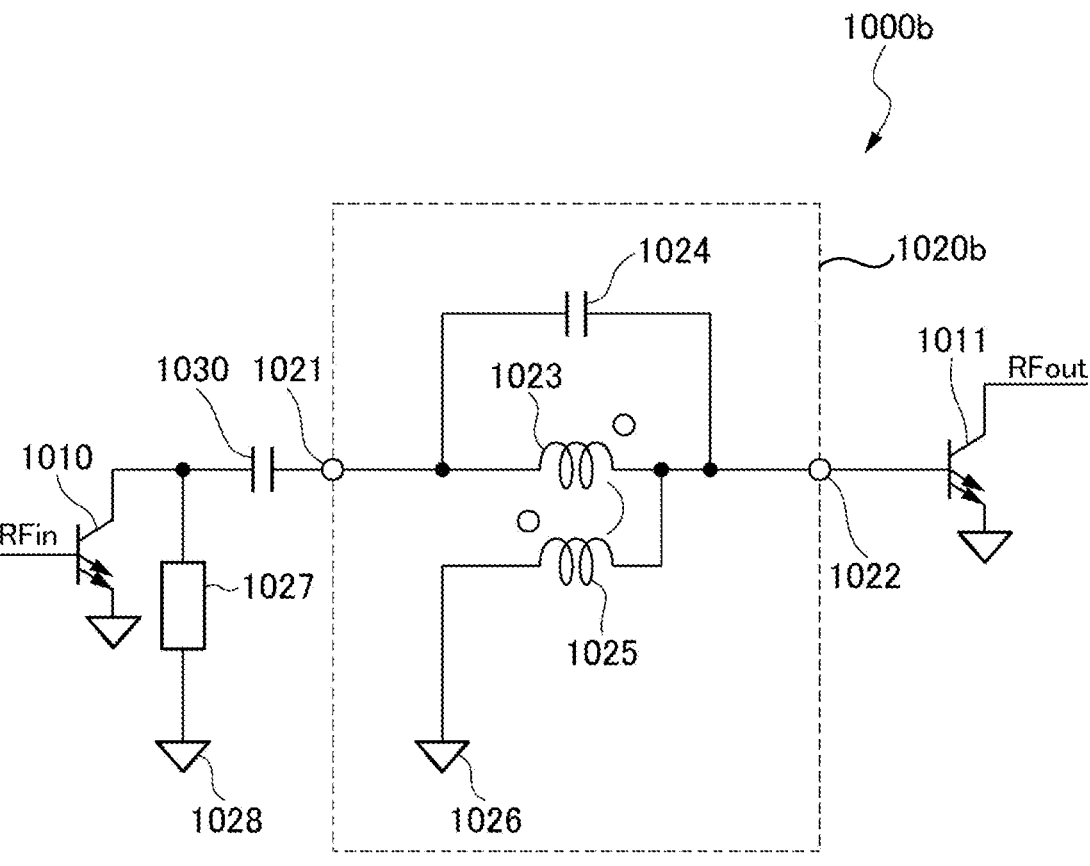
FIG. 17 is a diagram illustrating an example configuration of a second modification of the power amplifier circuit according to the tenth embodiment.

The configuration of a second modification of the power amplifier circuit 1000 according to the tenth embodiment will be described with reference to FIG. 17. FIG. 17 is a diagram illustrating an example configuration of the second modification of the power amplifier circuit 1000 according to the tenth embodiment. As illustrated in FIG. 17, a power amplifier circuit 1000b according to the second modification includes a matching circuit 1020b. Unlike the matching circuit 1020 of the power amplifier circuit 1000 illustrated in FIG. 12, the matching circuit 1020b includes a resonant circuit 1027 having a first end connected to the collector (output terminal) of the driver amplifier 1010 and a second end connected to ground 1028. The resonant circuit 1027 is, for example, a series resonant circuit formed by a capacitor and an inductor and is configured to cause, for example, the third-harmonic load impedance to be close to zero. As a result, it is possible to improve the efficiency of the power amplifier circuit 1000b. While the second modification supports the third harmonic, the nth-order harmonic may be used.

Accordingly, the matching circuit 120 of the power amplifier circuit 100 according to an exemplary embodiment of the present disclosure includes the input terminal 121 configured to receive an amplified signal from the power amplifier 110, the output terminal 122, the inductor 123 (first inductor) having a first end connected to the input terminal 121, and a second end connected to the output terminal 122, the capacitor 124 (first capacitor) connected in parallel to the inductor 123 (first inductor), the inductor 125 (second inductor) having a first end connected to the input terminal 121, and a second end connected to the predetermined potential 127 (ground), and the resonant circuit 126 (first series resonant circuit) connected in parallel to the inductor 125 (second inductor). With this configuration, the matching circuit 120 can improve the efficiency of the power amplifier circuit 100.

In the matching circuit 120 of the power amplifier circuit 100, the predetermined potential 127 (ground) connected to the second end of the inductor 125 (second inductor) is different from a power supply to be supplied to the power amplifier 110. With this configuration, the matching circuit 120 can improve the efficiency of the power amplifier circuit 100.

In the matching circuit 120 of the power amplifier circuit 100, the predetermined potential 127 (ground) connected to the second end of the inductor 125 (second inductor) is a power supply to be supplied to the power amplifier 110. With this configuration, a matching circuit 920 can improve the efficiency of the power amplifier circuit 900.

In the matching circuit 220 of the power amplifier circuit 200, the resonant circuit 226 (first series resonant circuit)

includes the first resonant circuit 226a (second series resonant circuit), the switch 226b (first switch) connected in series with the first resonant circuit 226a (second series resonant circuit), and the second resonant circuit 226c (third series resonant circuit) connected in parallel to the first resonant circuit 226a (second series resonant circuit) and the switch 226b (first switch). With this configuration, the matching circuit 220 can increase the bandwidth of the power amplifier circuit 200.

In the matching circuit 320 of the power amplifier circuit 300, the resonant circuit (resonant circuit corresponding to the first resonant circuit 226a) (second series resonant circuit) includes the capacitor 326b (second capacitor), and the inductor 326c (third inductor) connected in series with the capacitor 326b (second capacitor). With this configuration, the matching circuit 320 can adjust the load impedance of the output terminal 322 seen from the input terminal 321 at the fundamental frequency, and can thus improve the efficiency of the power amplifier circuit 300.

In the matching circuit 420 of the power amplifier circuit 400, the resonant circuit (resonant circuit corresponding to the second resonant circuit 226c illustrated in FIG. 5) (third series resonant circuit) includes the capacitor 426a (third capacitor), the switch 426c (second switch) connected in series with the capacitor 426a (third capacitor), and the inductor 426b (fourth inductor) connected in series with the switch 426c (second switch). With this configuration, by turning on or off the switch 426c, the value of the load impedance of the output terminal 422 seen from the input terminal 421 at the fundamental frequency can be selectively adjusted, and the efficiency of the power amplifier circuit 400 can thus be improved.

In the matching circuit 520 of the power amplifier circuit 500, the resonant circuit 526 (first series resonant circuit) includes the capacitor 526a (fourth capacitor), the inductor 526b (fifth inductor) connected in series with the capacitor 526a (fourth capacitor), the switch 526c (third switch) connected in series with the inductor 526b (fifth inductor), and the inductor 526d (sixth inductor) connected in parallel to the inductor 526b (fifth inductor) and the switch 526c (third switch). With this configuration, the matching circuit 520 can increase the bandwidth of the power amplifier circuit 500.

In the matching circuit 620 of the power amplifier circuit 600, the resonant circuit 626 (first series resonant circuit) includes the inductor 626a (seventh inductor), the capacitor 626b (fifth capacitor) connected in series with the inductor 626a (seventh inductor), the switch 626c (fourth switch) connected in series with the capacitor 626b (fifth capacitor), and the capacitor 626d (sixth capacitor) connected in parallel to the capacitor 626b (fifth capacitor) and the switch 626c (fourth switch). With this configuration, the matching circuit 620 can increase the bandwidth of the power amplifier circuit 600.

The power amplifier circuit 700 includes the matching circuit 720, the power amplifier 710, and the series resonant circuit 711 (fourth series resonant circuit) having a first end connected to the output terminal 722 of the power amplifier 710, and a second end connected to the ground 713 (ground). With this configuration, the capacitance of the capacitor 711b of the series resonant circuit 711 can be increased even when the power amplifier circuit 700 has a high operating frequency.

In the power amplifier circuit 800, the series resonant circuit 811 (fourth series resonant circuit) includes the inductor 811a (eighth inductor), and the capacitor 811b (sixth capacitor) connected in series with the inductor 811a (eighth inductor), and the resonant circuit 826 (first series resonant circuit) includes the inductor 826*a* (ninth inductor) to be magnetically coupled to the inductor 811*a* (eighth inductor). With this configuration, the resonant frequency of the series resonant circuit 811 formed by the inductor 811*a* and the capacitor 811*b* on the substrate 830 on which a power amplifier 810 is arranged can be adjusted.

The matching circuit 1020 is the matching circuit 1020 between the driver amplifier 1010 (first power amplifier) and the output amplifier 1011 (second power amplifier), and includes the input terminal 1021 configured to receive an amplified signal from the driver amplifier 1010 (first power amplifier), the output terminal 1022, the inductor 1023 (tenth inductor) having a first end connected to the input terminal 1021, and a second end connected to the output terminal 1022, the capacitor 1024 (seventh capacitor) connected in parallel to the inductor 1023 (tenth inductor), and the inductor 1025 (eleventh inductor) having a first end connected to the output terminal 1022, and a second end connected to the ground 1026. With this configuration, it is possible to increase the bandwidth of the load impedance in the frequency band of the fundamental wave and to cause the load impedance to be close to infinity in the frequency band of the second harmonic wave. Thus, the efficiency of the power amplifier circuit 1000 can be improved.

In the matching circuit 1020*a*, the capacitors 1024*a* (seventh capacitor) include a plurality of capacitors, and the matching circuit 1020*a* further includes the switches 1024*b* (fifth switches), each connected in series with a corresponding one of the plurality of capacitors in the capacitors 1024*a* (seventh capacitor). With this configuration, the resonant frequency of a parallel resonant circuit formed by the inductor 1023 and the capacitors 1024*a* can be adjusted.

The matching circuit 1020*b* further includes the resonant circuit 1027 (fifth series resonant circuit) having a first end connected to the output terminal of the driver amplifier 1010 (first power amplifier), and a second end connected to the ground 1028. With this configuration, it is possible to cause the third-harmonic load impedance to be close to zero. Thus, the efficiency of the power amplifier circuit 1000*b* can be improved.

The power amplifier circuit 1000 includes the matching circuit 1020, the driver amplifier 1010 (first power amplifier), the output amplifier 1011 (second power amplifier), and the capacitor 1030 (eighth capacitor) between the matching circuit 1020 and the driver amplifier 1010 (first power amplifier). With this configuration, it is possible to increase the bandwidth of the load impedance in the frequency band of the fundamental wave and to cause the load impedance to be close to infinity in the frequency band of the second harmonic wave.

The embodiments described above are intended to facilitate understanding of the present disclosure and should not be used to construe the present disclosure in a limiting fashion. The present disclosure may be modified or improved without necessarily departing from the spirit thereof, and the present disclosure also includes its equivalents. That is, the embodiments may be appropriately modified in design by those skilled in the art, and such modifications also fall within the scope of the present disclosure so long as the modifications include the features of the present disclosure. The elements included in the embodiments and the arrangement and so on thereof are not limited to those illustrated exemplarily, but can be modified as appropriate.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A matching circuit comprising:
an input terminal configured to receive an amplified signal from a power amplifier;
an output terminal;
a first inductor having a first end connected to the input terminal, and a second end connected to the output terminal;
a second inductor having a first end connected to the input terminal, and a second end connected to a reference potential; and
a first series resonant circuit connected in parallel to the second inductor,
wherein the first inductor and the second inductor are electromagnetically coupled to each other.

2. The matching circuit according to claim 1, further comprising a first capacitor connected in parallel to the first inductor.

3. The matching circuit according to claim 1, wherein the reference potential connected to the second end of the second inductor is different than a power supply potential of the power amplifier.

4. The matching circuit according to claim 3, further comprising a first capacitor connected in parallel to the first inductor.

5. The matching circuit according to claim 1, wherein the reference potential connected to the second end of the second inductor is a power supply potential of the power amplifier.

6. The matching circuit according to claim 5, further comprising a first capacitor connected in parallel to the first inductor.

7. The matching circuit according to claim 1, wherein the first series resonant circuit comprises:
a second series resonant circuit;
a first switch connected in series with the second series resonant circuit; and
a third series resonant circuit connected in parallel to the second series resonant circuit and in parallel to the first switch.

8. The matching circuit according to claim 7, wherein the second series resonant circuit comprises:
a second capacitor; and
a third inductor connected in series with the second capacitor.

9. The matching circuit according to claim 7, wherein the third series resonant circuit comprises:
a third capacitor;
a second switch connected in series with the third capacitor; and
a fourth inductor connected in series with the second switch.

10. The matching circuit according to claim 1, wherein the first series resonant circuit comprises:
a fourth capacitor;
a fifth inductor connected in series with the fourth capacitor;
a third switch connected in series with the fifth inductor; and
a sixth inductor connected in parallel to the fifth inductor and in parallel to the third switch.

11. The matching circuit according to claim 1, wherein the first series resonant circuit comprises:

a seventh inductor;

a fifth capacitor connected in series with the seventh inductor;

a fourth switch connected in series with the fifth capacitor; and a sixth capacitor connected in parallel to the fifth capacitor and in parallel to the fourth switch.

12. A power amplifier circuit comprising:

the matching circuit according to claim 1;

the power amplifier; and a fourth series resonant circuit having a first end connected to an output terminal of the power amplifier, and a second end connected to a reference potential.

13. The power amplifier circuit according to claim 12, wherein the fourth series resonant circuit comprises:

an eighth inductor; and a sixth capacitor connected in series with the eighth inductor, and wherein the first series resonant circuit comprises a ninth inductor magnetically coupled to the eighth inductor.

14. The matching circuit according to claim 13, further comprising a fifth series resonant circuit having a first end connected to an output terminal of the first power amplifier, and a second end connected to a reference potential.

15. A matching circuit between a first power amplifier and a second power amplifier, the matching circuit comprising:

an input terminal configured to receive an amplified signal from the first power amplifier;

an output terminal;

a tenth inductor having a first end connected to the input terminal, and a second end connected to the output terminal;

a seventh capacitor connected in parallel to the tenth inductor; and an eleventh inductor having a first end connected to the output terminal, and a second end connected to a reference potential, wherein the tenth inductor and the eleventh inductor are electromagnetically coupled to each other.

16. The matching circuit according to claim 15, wherein the seventh capacitor comprises a plurality of capacitors, and wherein the matching circuit further comprises a plurality of fifth switches, each of the plurality of fifth switches being connected in series with a corresponding one of the plurality of capacitors of the seventh capacitor.

17. A power amplifier circuit comprising:

the matching circuit according to claim 15;

the first power amplifier;

the second power amplifier; and an eighth capacitor connected between the matching circuit and the first power amplifier.

* * * * *